US009541968B2

(12) United States Patent
Chen et al.

(10) Patent No.: US 9,541,968 B2
(45) Date of Patent: Jan. 10, 2017

(54) HOUSING HAVING FIXING MECHANISM

(71) Applicants: LITE-ON ELECTRONICS (GUANGZHOU) LIMITED, Guangzhou (CN); LITE-ON TECHNOLOGY CORPORATION, Taipei (TW)

(72) Inventors: Chuan-Feng Chen, Taipei (TW); Chin-Pang Hsu, Taipei County (TW); Chin-Yueh Liu, New Taipei (TW); Hung-Hsing Chiu, Keelung (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/918,766

(22) Filed: Oct. 21, 2015

(65) Prior Publication Data
US 2016/0224073 A1 Aug. 4, 2016

(30) Foreign Application Priority Data

Feb. 4, 2015 (CN) .................... 2015 2 0079893 U

(51) Int. Cl.
*G06F 1/16* (2006.01)
*G06F 1/18* (2006.01)
*H05K 5/02* (2006.01)

(52) U.S. Cl.
CPC .............. *G06F 1/181* (2013.01); *G06F 1/187* (2013.01); *H05K 5/0221* (2013.01)

(58) Field of Classification Search
CPC ........ G06F 1/181; G06F 1/187; H05K 5/0221; A47B 96/14
USPC ... 312/223.1, 223.2, 300, 319.2; 361/679.02, 361/679.37, 679.39, 727, 807, 810
See application file for complete search history.

(56) References Cited

U.S. PATENT DOCUMENTS

| | | | |
|---|---|---|---|
| 8,690,267 B2 | 4/2014 | Jiang et al. | |
| 2005/0068720 A1* | 3/2005 | Lambert | G06F 1/187 361/679.03 |
| 2008/0116774 A1* | 5/2008 | Chen | G06F 1/187 312/223.2 |
| 2008/0137281 A1* | 6/2008 | Chen | G11B 33/123 361/679.33 |
| 2012/0056515 A1* | 3/2012 | Chen | H05K 7/1487 312/223.2 |

* cited by examiner

*Primary Examiner* — James O Hansen
(74) *Attorney, Agent, or Firm* — Li&Cai Intellectual Property (USA) Office

(57) ABSTRACT

A housing having a fixing mechanism for fixing at least one electronic device includes a housing body and a pivotable fixing mechanism. The fixing mechanism includes a first positioning device and a second positioning device. The second positioning device has a first fixing member for accommodating a electronic device, and a second fixing member detachably engaged with the first positioning device to fix the second positioning device in a first position on the first positioning device. When the second fixing member is disengaged, the second positioning device is fixed in a second position on the first positioning device, and when the first positioning device is rotated outwards relative to the housing body, the second positioning device can be removed or installed on the first positioning device through the second fixing member.

9 Claims, 11 Drawing Sheets

HOUSING HAVING FIXING MECHANISM

BACKGROUND OF THE INVENTION

1. Field of the Invention

The invention relates to a housing, more particularly to a computer housing that uses a pivotable fixing mechanism instead of screws to mount an electronic device to a housing body, and is rotated outward of the housing body to facilitate assembly or disassembly of the electronic device.

2. Description of Related Art

Existing computer housings have vertical, horizontal, thin and industrial specification designs. In order to increase the functions of a computer, many peripheral electronic devices (for example, an optical disk drive, a hard disk, or the like) are installed in the housing thereof. In the prior art, for the convenience of fixing an electronic device into a housing body, an auxiliary fixing component has been used to fix the electronic device into a housing body of a mainframe in an engagement manner, in place of a screw. For example, in the issued patent U.S. Pat. No. 8,690,267 titled "Assembly unit and casing having the same" of the applicant, an operator can conveniently remove or install an electronic device without a screw or a tool.

However, the development tendency of personal computers is miniaturization and with the decrease in volume of a mainframe of a computer, the internal space of a housing becomes limited. In addition to installment of various electronic devices, examination and maintenance of other components (for example, a memory card, a cooling fan, and the like) in a housing body is needed. In such a case, a signal cable and a power cable connected to a mainframe must be removed before the electronic device or other components are removed. In other words, the existing installment or removal operation by screwing or unscrewing is difficult to perform or even cannot be performed in the limited space of the housing.

SUMMARY OF THE INVENTION

The present invention provides a housing having a fixing mechanism, where through a pivotable fixing mechanism instead of screw to mount an electronic device to a housing body to facilitate assembly or disassembly of the electronic device, so as to reduce an occupied internal space of the housing and also satisfy the requirement of a user for convenient installment.

The present invention provides a housing having a fixing mechanism, where a pivotable fixing structure is rotatable outside the housing, so that an internal component of the housing can be conveniently examined or maintained by an operator without being completely removed.

In order to achieve the above objectives, the present invention provides a housing having a fixing mechanism for holding an electronic device, where the housing comprises a housing body and a fixing mechanism. The housing body has a front plate. The fixing mechanism includes a first positioning device and a second positioning device. The first positioning device is rotatably connected to the housing body and has an accommodating portion for accommodating the second positioning device, where the accommodating portion has a wall surface. The second positioning device is received in the accommodating portion and has a first fixing member for accommodating the electronic device and a second fixing member connected to a side end of the first fixing member. The second fixing member is detachably engaged with the wall surface to fix the second positioning device in a first position on the first positioning device; when the second fixing member is disengaged from the wall surface, an end of the electronic device is away from the front plate of the housing body, whereby the first positioning device is in a rotatable state relative to the housing body.

The beneficial effects of the present invention are that, in the housing provided in the embodiment of the present invention, through a fixing mechanism for an electronic device, the electronic device can be conveniently fixed in different positions, including a first position (for example, for operation) and a second position (for example, for examination or maintenance), on a first positioning device without a screw. Thus, an internal component of a housing of a mainframe can be examined or maintained by an operator without removing the electronic device.

In order to further understand the features and technical content of the present invention, reference is made to the following detailed description and accompanying drawings of the present invention. However, the accompanying drawings are only intended for reference and illustration, but do not limit the present invention.

DETAILED DESCRIPTION OF THE PREFERRED EMBODIMENTS

Unless otherwise stated, a number or similar expression mentioned in the embodiments described below is not intended to limit the application scope of the present invention. The directional terms, such as left, right, front or back, mentioned in the present invention are merely provided with reference to the accompanying drawings and are intended to illustrate but not to limit the present invention.

Figure 1:
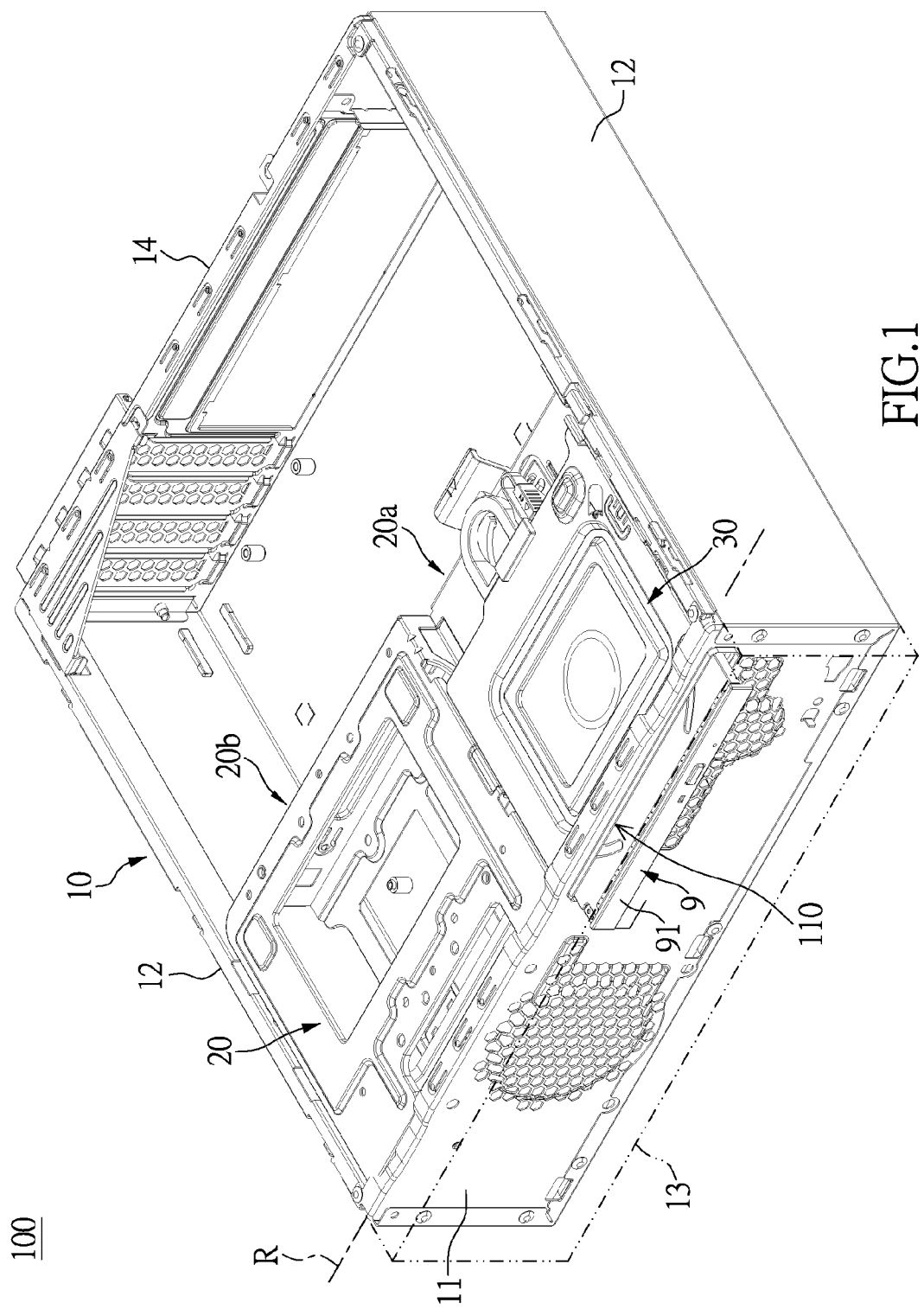
FIG. 1 is an assembled perspective view of a housing of the present invention.
Figure 2:
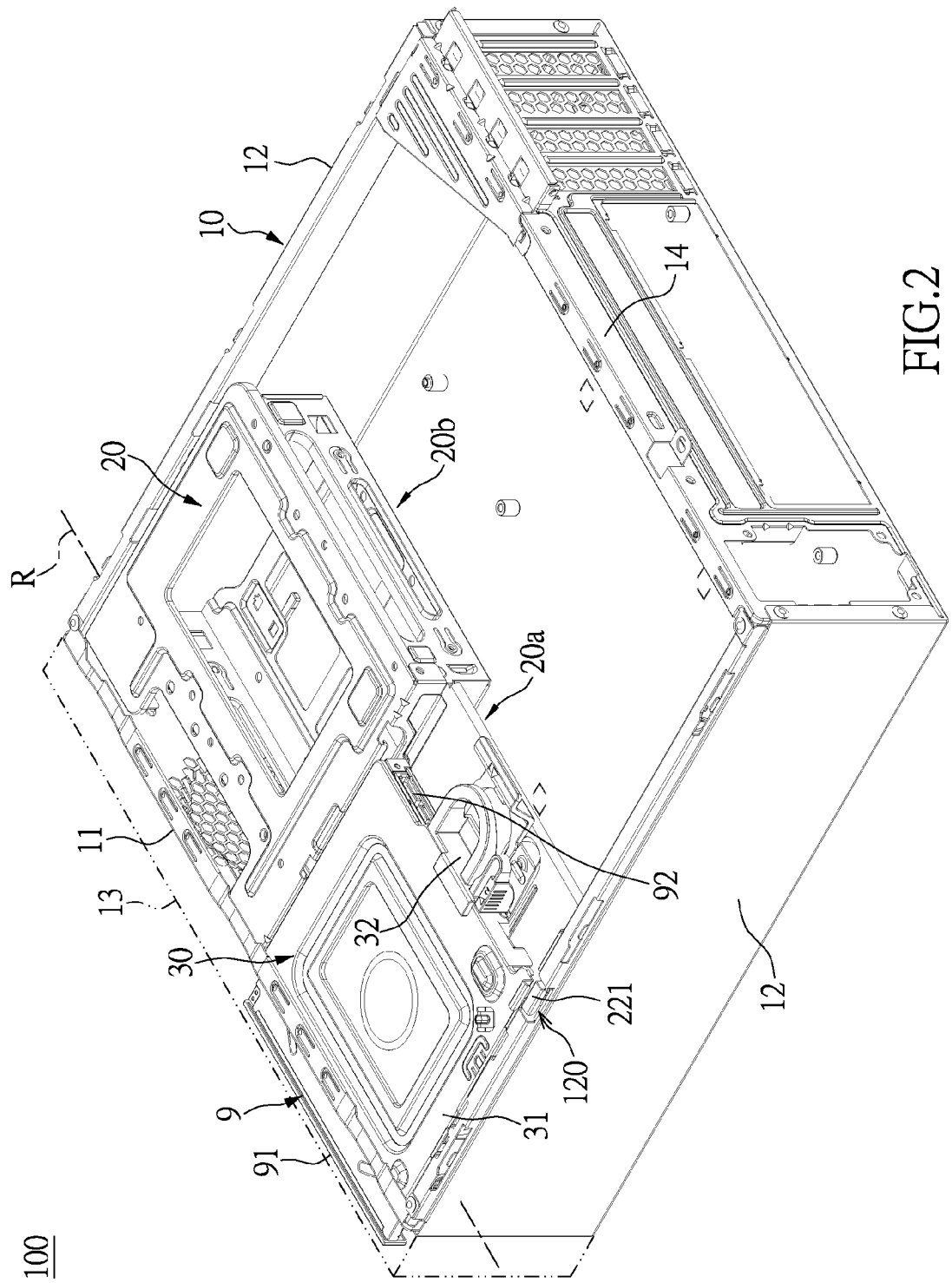
FIG. 2 is another assembled perspective view of the housing of the present invention.

Referring to FIG. 1 and FIG. 2, assembled perspective views of a housing of the present invention are shown. The present invention provides a housing 100, for holding an electronic device 9, such as a computer peripheral medium. The housing 100 includes a housing body 10, a first positioning device 20 rotatably connected to the housing body 10, and a second positioning device 30 drawably disposed in the first positioning device 20. In the embodiment below, a housing body of a horizontal mainframe is taken as an example of the housing body 10 and a thin optical disk drive is taken as an example of the electronic device 9, but the present invention is limited thereto. For example, the electronic device 9 may also be a hard disk. A front end 91 of the thin optical disk drive is a panel of an optical disk tray and a back end 92 of the thin optical disk drive is provided with a connector for connecting a signal cable (not shown) and a power cable (not shown).

The housing body 10 has a front plate 11, two side plates 12, and a back plate 14. The front plate 11 has a device opening 110 for the electronic device 9 to be exposed out of the front plate 11. A front panel 13 (as shown by the dotted line) for a user to operate is disposed in front of the housing body 10. The electronic device 9 in this embodiment is fixed to the second positioning device 30. The front end 91 of the electronic device 9 passes through the device opening 110 of the front plate 11 and is adjacent to the front panel 13 to be arranged in combination with operation of the front panel 13.

As shown in FIG. 2, the first positioning device 20 may be of a bracket design and horizontally corresponds to the housing body 10. The first positioning device 20 has a side rotatably connected to the front plate 11 of the housing body 10 and may be viewed as a rotatable bracket. Therefore, the first positioning device 20 can change from the state of being horizontally fixed to the housing body 10 to a vertical state. When a user wants to maintain or install/remove an internal component, first, the first positioning device 20 in the horizontal state is unfixed from the housing body 10, and then, the first positioning device 20 may be turned upwards and outwards and is fixed above the front plate 11 in the vertical state (see FIG. 7 and FIG. 8). As such, the first positioning device 20 does not cover the internal space of the housing body 10.

Figure 3:
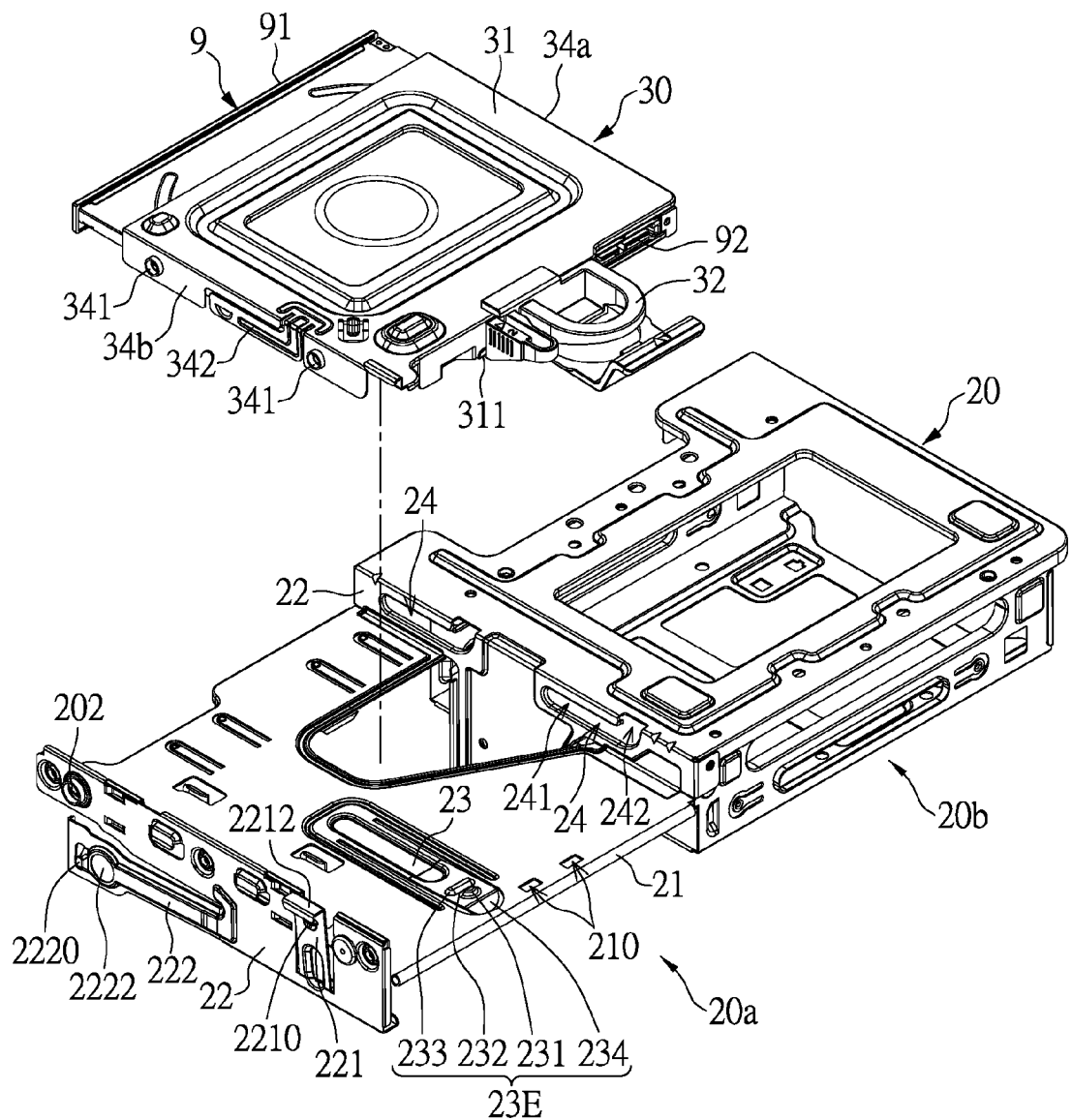
FIG. 3 is a perspective view of a first positioning device and a second positioning device of the present invention.

Referring to FIG. 3, in this embodiment, pivots 202 at two sides of the first positioning device 20 are configured to rotate about a rotation axis R (as shown in FIG. 1 and FIG. 2), where the rotation axis R is along a longitudinal direction of the front plate 11. The fixation of the first positioning device 20 to the housing body 10 is illustrated as follows. A side wall 22 of the first positioning device 20 is provided with a first limiting arm 221 and a second limiting arm 222. The first limiting arm 221 fixes the first positioning device 20 to the housing body 10 in the horizontal state. The first limiting arm 221 is provided with a first locking block 2210 and a first unlocking portion 2212. The corresponding side plate 12 of the housing body 10 is provided with a first locking hole 120 (see FIG. 7). When the first locking block 2210 of the first limiting arm 221 is engaged in the first locking hole 120 of the side plate 12, the first positioning device 20 is fixed to the housing body 10 in the horizontal state. When intending to turn the first positioning device 20 upwards, an operator presses the first limiting arm 221 to disengage the first locking block 2210 from the first locking hole 120 of the side plate 12, whereby the first positioning device 20 can be turned upwards.

The first positioning device 20 in this embodiment has two accommodating portions in communication with each other. The two accommodating portions may be called a first accommodating portion 20a and a second accommodating portion 20b for accommodating a plurality of electronic devices. The second positioning device 30 is drawably disposed on the first accommodating portion 20a (i.e., the left accommodating portion shown in FIG. 3) of the first positioning device 20 and can be fixed in different positions on the first accommodating portion 20a (details are described below). The first accommodating portion 20a has a wall surface 21 and a pair of side walls 22, where the wall surface 21 is formed with a positioning arm 23. The second accommodating portion 20b can accommodate at least one hard disk (not shown).

Figure 4:
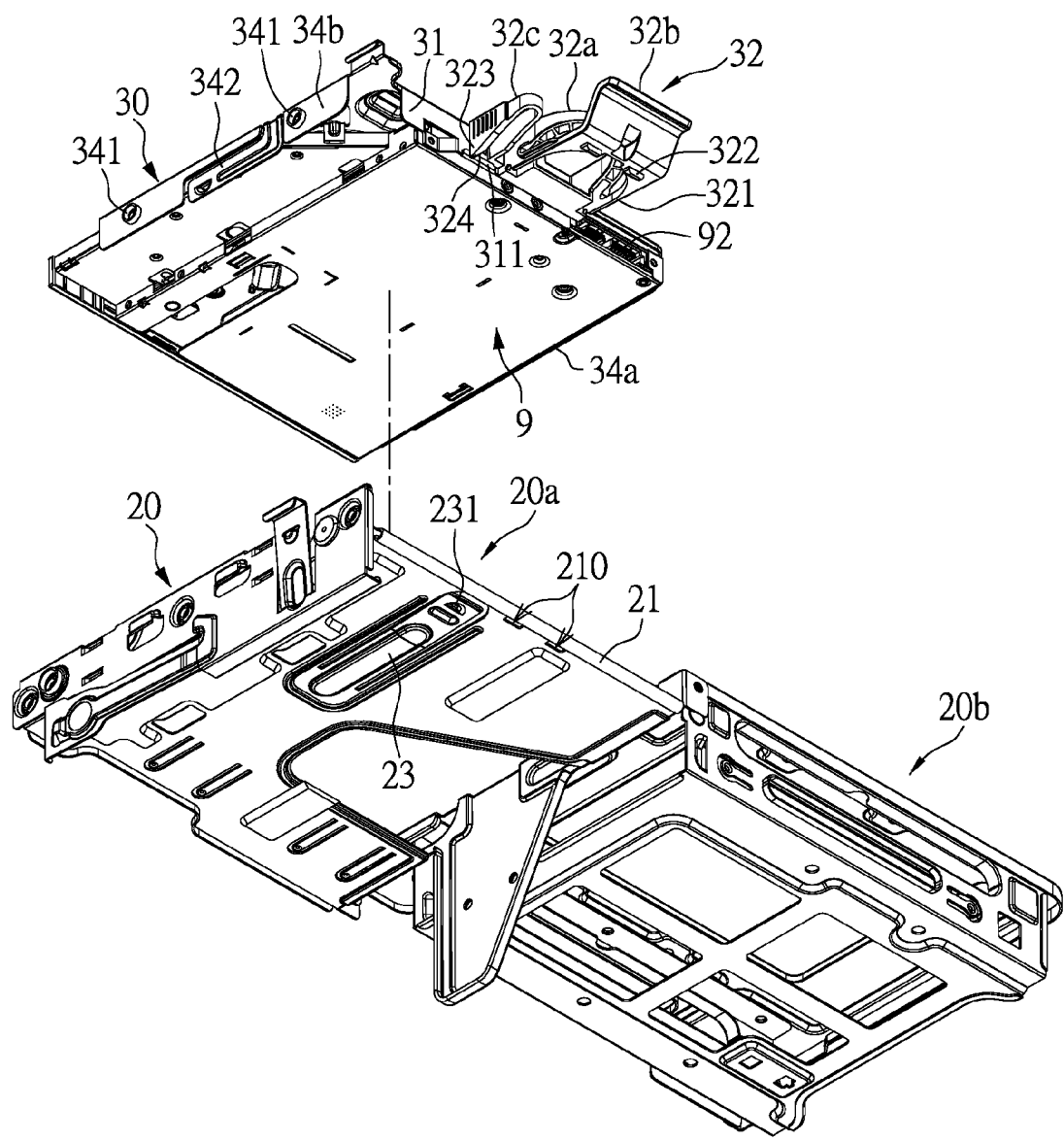
FIG. 4 is another perspective view of the first positioning device and the second positioning device of the present invention.

As shown in FIG. 3 and FIG. 4, the second positioning device 30 may be viewed as a drawable frame. The second positioning device 30 has a first fixing member 31 for fixedly receiving the electronic device 9 and a second fixing member 32 fixed at a back end of the first fixing member 31 to function as a pull handle.

Figure 3A:
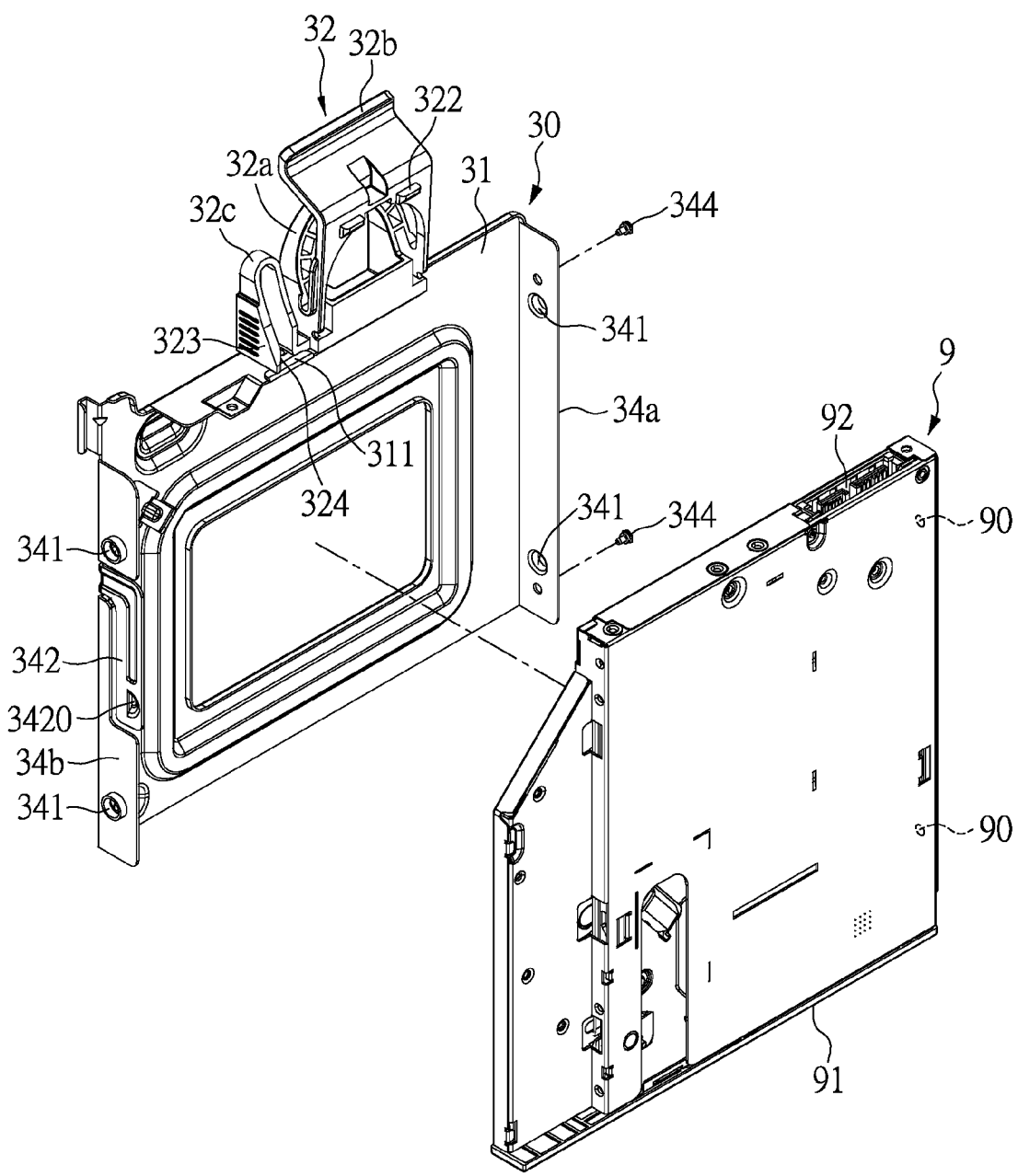
FIG. 3A is a schematic view showing that the first positioning device of the present invention is separated from an electronic device.

Referring to FIG. 3A, an exemplary manner for fixing the electronic device 9 to the second positioning device 30 is illustrated as follows. The second positioning device 30 in this embodiment has a pair of side housing bodies 34a, 34b. The side housing body 34a may be provided with two fixing members 344, for example, convex columns or screws, for being inserted into fixing holes 90 at a side of the electronic device 9. The side housing body 34b of the first fixing member 31 is formed with a holding arm 342 for holing one side of the electronic device 9. The holding arm 342 is substantially L-shaped, and has an end elastically connected to the first fixing member 31 and a free end formed with a holding latch 3420. The holding latch 3420 is held in a bottom edge of the side of the electronic device 9.

One of the characteristics of this embodiment is that, the second fixing member 32 is detachably engaged with the wall surface 21, so as to correspondingly fix the second positioning device 30 in a first position on the first positioning device 20, i.e., a use position (see FIG. 1 and FIG. 2), and the front end 91 of the electronic device 9 protrudes from the front plate 11 of the housing body 10. As shown in FIG. 1 and FIG. 2, the first position refers to a position where when the first positioning device 20 is horizontally placed, the second positioning device 30 on the first positioning device 20 is pushed forwards close to the front plate 11, and the front end 91 of the electronic device 9 protrudes from the front plate 11, that is, the front end 91 is adjacent to the front panel 13, for a user to conveniently remove or insert the electronic device 9.

When the second fixing member 32 is disengaged from the wall surface 21, the positioning arm 23 is detachably engaged with a bottom surface of the first fixing member 31, so as to correspondingly fix the second positioning device 30 in a second position on the first positioning device 20, for example, a servicing position (see FIG. 5 to FIG. 8), and the front end 91 of the electronic device 9 is separated from the front plate 11 of the housing body 10, whereby the first positioning device 20 is in a rotatable state relative to the housing body 10 of the mainframe. The second position refers to another position where the second positioning device 30 and the electronic device 9 are moved backward for a distance and are fixed on the first positioning device 20, and in this case, the first positioning device 20 can rotate relative to the housing body 10 of the mainframe to the vertical state, so that the housing body 10 of the mainframe can be serviced or used for other uses.

It is noted that, the fixation of the electronic device 9 in the second position is an exemplary description for an operator or a serviceman to conveniently perform relevant operations without completely removing the electronic device 9. However, the present invention is not limited thereto. After the front end 91 of the electronic device 9 is separated from the front plate 11 of the housing body 10, the operator can directly pull the electronic device 9 out to be completely separated from the second positioning device 30, without fixing the electronic device 9 in the second position. In such case, the positioning arm 23 may be omitted.

Referring to FIG. 4, an exemplary manner for detachably engaging the second fixing member 32 with the wall surface 21 in this embodiment is illustrated as follows. A pair of wedge-shaped engaging blocks 322 is formed on a bottom surface of the second fixing member 32, a pair of engaging holes 210 is formed in the wall surface 21 of the first accommodating portion 20a, and the pair of engaging blocks 322 is engaged in the pair of engaging holes 210. In this embodiment, the pair of engaging holes 210 is close to a back edge of the wall surface 21. In this embodiment, the second fixing member 32 is elastic and thus can be elastically abutted against the first positioning device 20. The second fixing member 32 includes a pull ring 32a and a wrench portion 32b on a bottom surface of the pull ring 32a. The wrench portion 32b has a pair of elastic arms 321 elastically connected to the pull ring 32a. The pair of engaging blocks 322 is formed on the bottom surface of the wrench portion 32b. There may be at least one engaging block 322 and at least one engaging hole 210.

An exemplary manner for detachably engaging the positioning arm 23 with the first fixing member 31 in this embodiment is illustrated below. Referring to FIG. 3, the first fixing member 31 has a frame limiting portion 311 and the positioning arm 23 has a bracket limiting portion 23E, where the frame limiting portion 311 of the first fixing member 31 is detachably engaged with the bracket limiting portion 23E of the positioning arm 23 to fix the second positioning device 30 in the second position on the first positioning device 20. Further, the frame limiting portion 311 of the first fixing member 31 is a plate protruding downwards and bent from the first fixing member 31. The bracket limiting portion 23E of the positioning arm 23 includes a pair of bumps 231, 233 and a recess 232 between the pair of bumps 231, 233. The frame limiting portion 311 is limited in the recess 232.

In this embodiment, a manner of disengaging the positioning arm 23 from the first fixing member 31 is illustrated as follows. A free end of the positioning arm 23 is provided with a bent portion 234 obliquely extending downwards, which can be wrenched downwards by the operator so that the positioning arm 23 of the first positioning device 20 is separated from the frame limiting portion 311 of the first fixing member 31, whereby the second positioning device 30 can be moved to be separated from the first positioning device 20.

Referring to FIG. 4, this embodiment also is designed in another manner. The second positioning device 30 may include an unlocking button 32c at a side of the second fixing member 32. An unlocking arm 323 is elastically extended from the unlocking button 32c. The unlocking arm 323 is close to the frame limiting portion 311 of the first fixing member 31 and pushes against the positioning arm 23 of the first positioning device 20 so that the positioning arm 23 is separated from the frame limiting portion 311 of the first fixing member 31. An oblique abutting portion 324 is formed at an end of the unlocking arm 323. When the positioning arm 23 is engaged with the first fixing member 31, the oblique abutting portion 324 is located at a side of the bump 231. When a user presses the unlocking arm 323, a lateral force towards the pull ring 32a of the second fixing member 32 is generated. A downward component force is generated from the lateral force by the oblique abutting portion 324 to push the bump 231 downwards, so that the frame limiting portion 311 of the first fixing member 31 is separated from the recess 232 between the pair of bumps 231, 233. Therefore, the second positioning device 30 is completely drawn outwards from the first positioning device 20.

Referring to FIG. 3 and FIG. 4 again, in this embodiment, a limiting structure is formed between a side of the second positioning device 30 and the pair of side walls 22 of the first accommodating portion 20a, so as to limit a moving route of the second positioning device 30 from the first position (see FIG. 1) to the second position (see FIG. 5) to be in a longitudinal direction of the side walls 22 of the first accommodating portion 20a. This limiting structure can be implemented in many manners and is primarily used to prevent the second positioning device 30 from being separated from the first accommodating portion 20a during moving. The limiting structure in this embodiment is illustrated as follows. A pair of shaft portions 341 protrudes from each of two sides of the second positioning device 30, and a guide rail 24 is formed on each of the pair of side walls 22 of the first accommodating portion 20a, where the guide rail 24 is substantially L-shaped and has a longitudinal portion 241 parallel to a longitudinal direction of the side wall 22 and an outlet portion 242 formed by bending and extending the longitudinal portion 241. With the shaft portions 341 in cooperation with the guide rail 24, the second positioning device 30 is not separated from the first accommodating portion 20a during moving.

When the second positioning device 30 is located in the first position on the first positioning device 20, the shaft portions 341 of the second positioning device 30 are located at a bottom end of the longitudinal portion 241; when the second positioning device 30 is located in the second position on the first positioning device 20, the shaft portions 341 of the second positioning device 30 move backwards along the longitudinal portion 241, that is, move towards the outlet portion 242, and are approximately located in a middle position of the longitudinal portion 241. When intending to draw the second positioning device 30 to be separated from the first positioning device 20, the second positioning device 30 is pulled backwards to a junction of the longitudinal portions 241 and the outlet portion 242, whereby the second positioning device 30 can be completely drawn.

Figure 5:
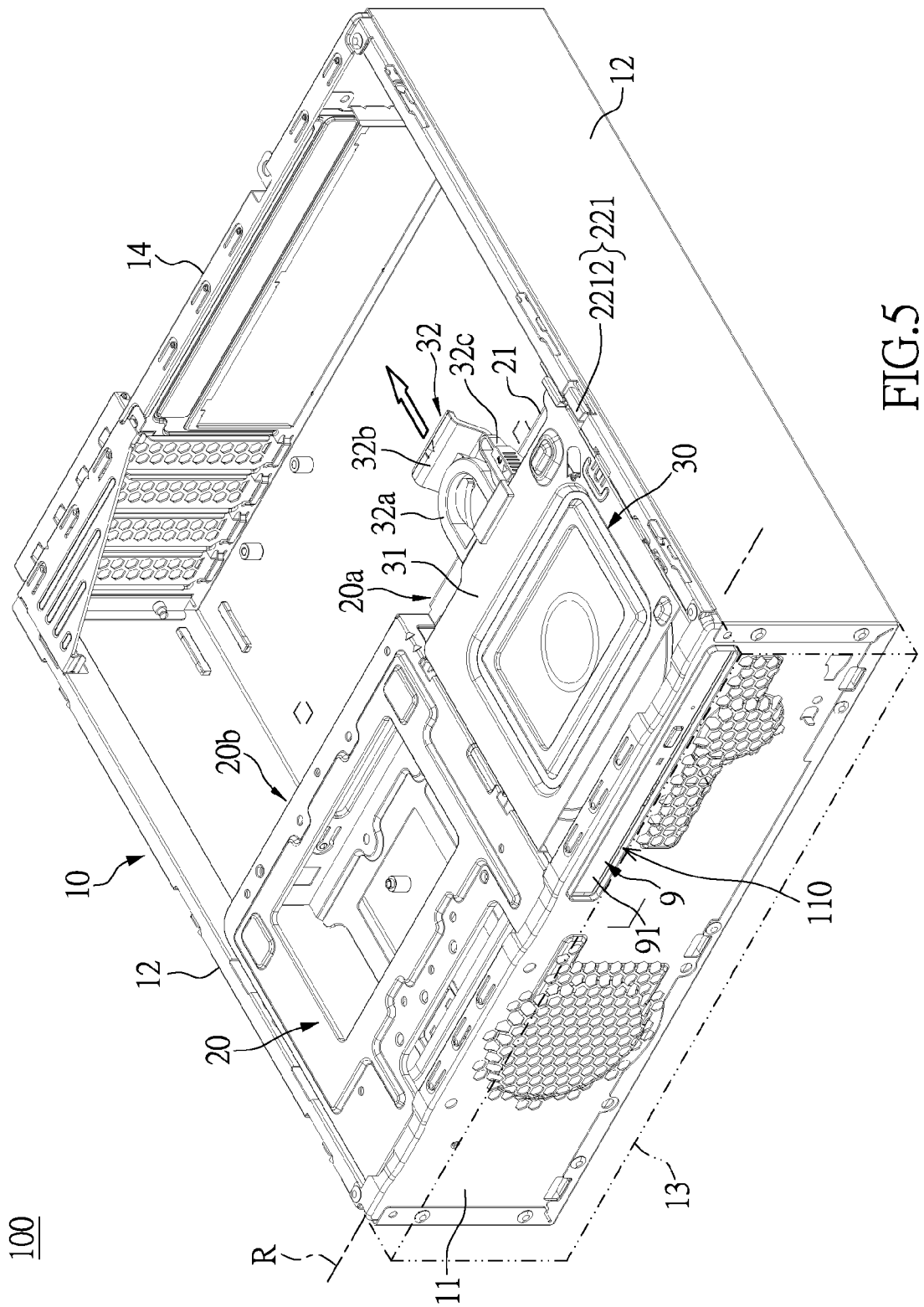
FIG. 5 and FIG. 6 are perspective views showing that the first positioning device of the housing of the present invention in different directions in a rotatable state.
Figure 6:
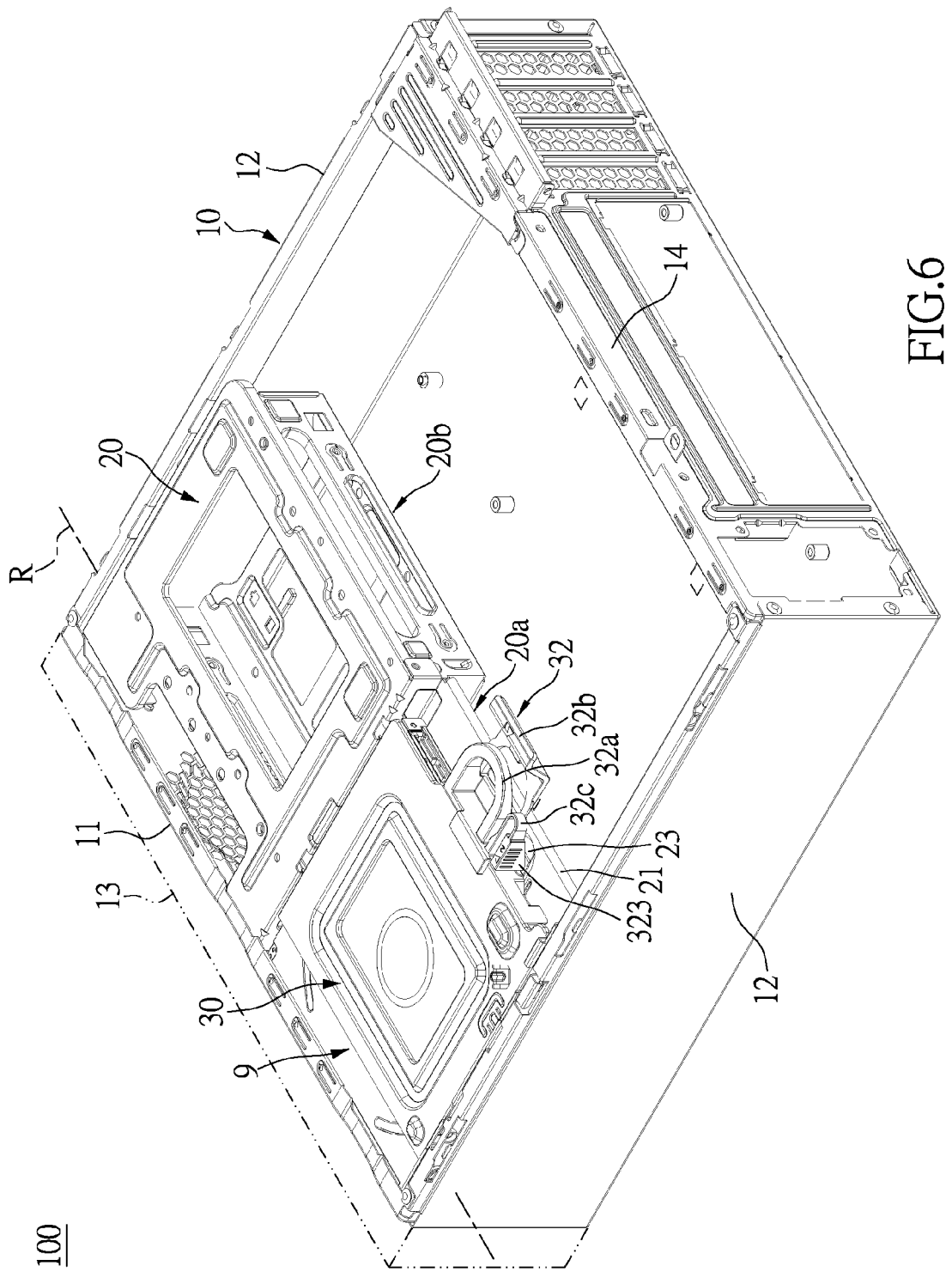

Referring to FIG. 5 and FIG. 6, in this embodiment, when servicing the mainframe of the computer, the operator only needs to slightly lift and pull the second fixing member 32 of the second positioning device 30 backwards. In this embodiment, a finger may be put into the pull ring 32a to wrench the wrench portion 32b, whereby the second fixing member 32 of the second positioning device 30 can be disengaged from the first accommodating portion 20a of the first positioning device 20. In this case, the second positioning device 30 along with the electronic device 9 can be moved backwards, that is, moved towards the back plate 14 of the housing body 10, until the front end 91 of the electronic device 9 is separated from the front plate 11 of the housing body 10. Thus, the second positioning device 30 is changed from the state (the first position) of protruding from the front plate 11 shown in FIG. 3 to the state (the second position) shown in FIG. 5.

In the process of pulling the second positioning device 30, the frame limiting portion 311 on a bottom surface of the second positioning device 30 slides along the wall surface 21 of the first accommodating portion 20a until the frame limiting portion 311 is engaged in the bracket limiting portion 23E of the positioning arm 23, that is, engaged in the recess 232 between the pair of bumps 231, 233 (see FIG. 3 and FIG. 4), so that the second positioning device 30 is fixed in the second position on the first positioning device 20, as shown in FIG. 5 and FIG. 6.

Figure 7:
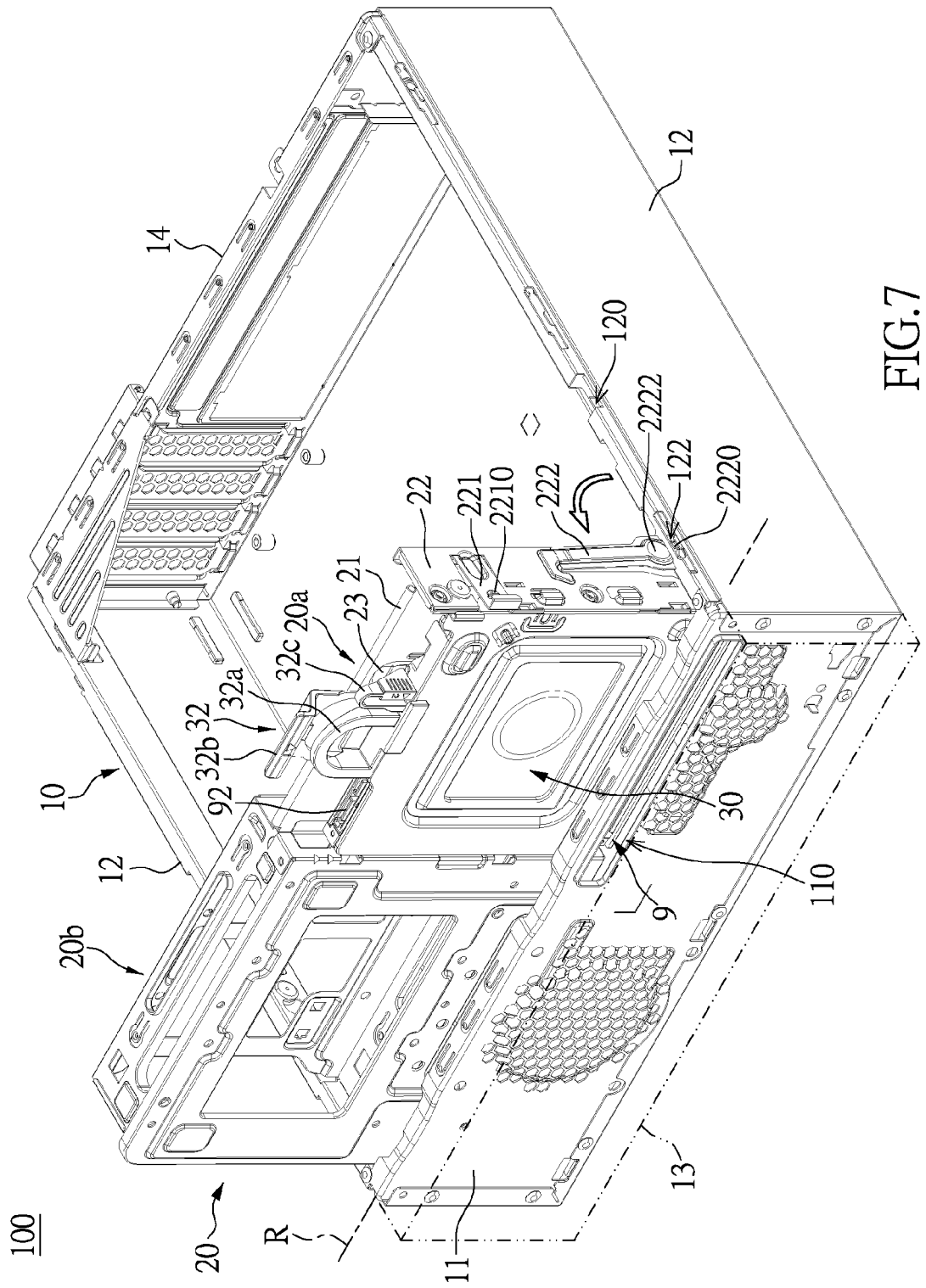
FIG. 7 and FIG. 8 are perspective views showing that the first positioning device of the housing of the present invention in different directions in a vertical state.
Figure 8:
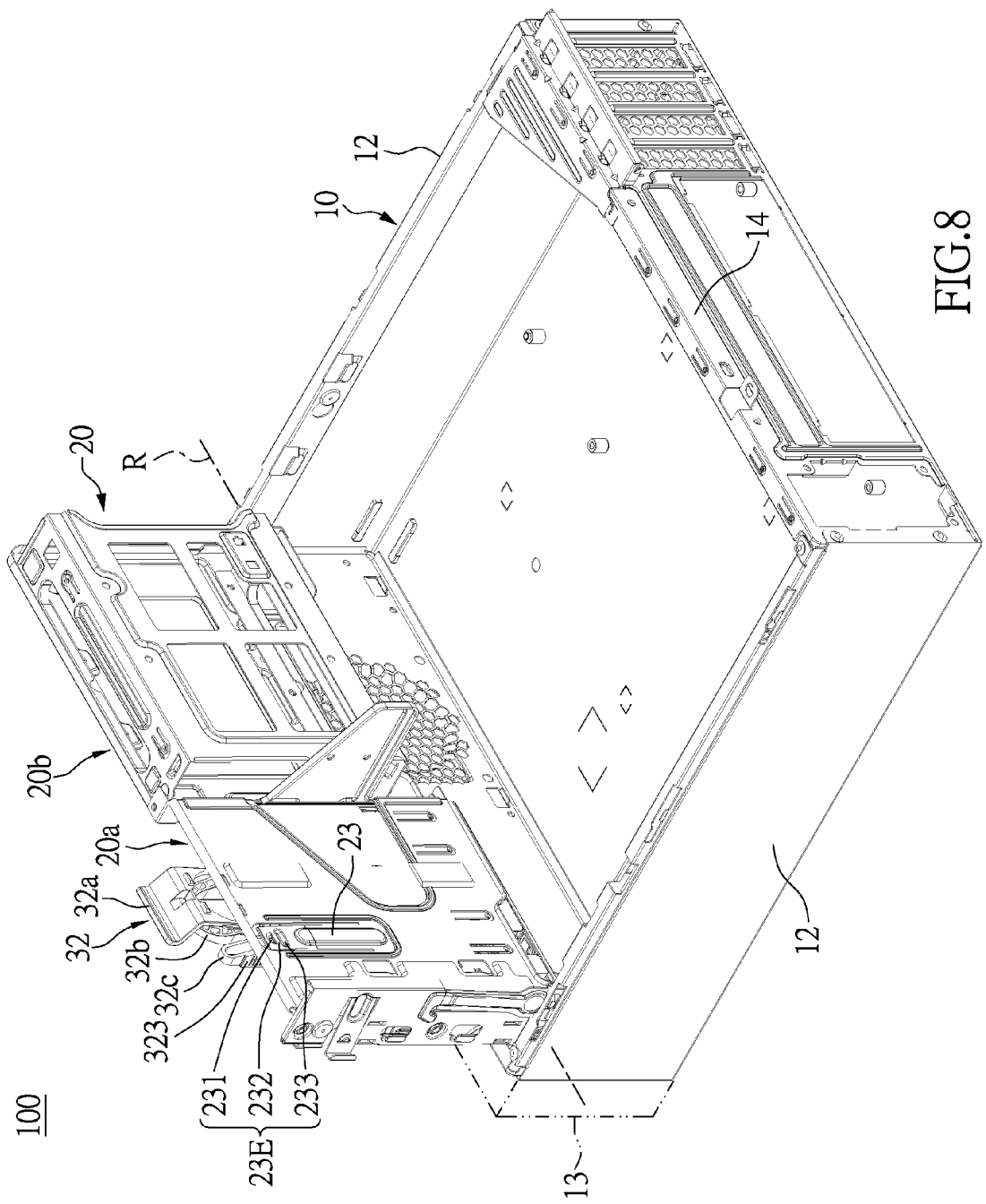

As shown in FIG. 7 and FIG. 8, the operator can rotate the first positioning device 20 outwards through about 90 degrees around the rotation axis R, so that the first positioning device 20 along with the second positioning device 30 is in the vertical state. In this case, the operator can begin to service the mainframe, for example, a motherboard, a cooling fan, a memory card, or the like. In this embodiment, in the servicing process, the signal cable (not shown) and the power cable (not shown) at the back end 92 of the electronic device 9 do not need to be pulled out of the electronic device 9 and the electronic device 9 can still be fixed in the second position on the first positioning device 20 with the second positioning device 30. As such, the maintenance efficiency is improved.

Referring to FIG. 7 and FIG. 3, through the second limiting arm 222, the first positioning device 20 is fixed to the housing body 10 in the vertical state. The second limiting arm 222 is provided with a second locking block 2220 and a second unlocking portion 2222. The side plate 12 of the housing body 10 is provided with a second locking hole 122. The second locking block 2220 of the second limiting arm 222 is engaged in the second locking hole 122 so that the first positioning device 20 may be fixed to the housing body 10 in the vertical state.

When intending to turn the first positioning device 20 outwards, as shown in FIG. 5, the first unlocking portion 2212 of the first limiting arm 221 is pressed so that the first locking block 2210 of the first limiting arm 221 is disengaged from the first locking hole 120 (see FIG. 2 and FIG. 3), whereby the first positioning device 20 can be turned upwards and outwards from the housing body 10.

As shown in FIG. 7, when the first positioning device 20 is turned through about 90 degrees, the second locking block 2220 is engaged in the second locking hole 122 of the housing body 10, whereby the first positioning device 20 is fixed in the vertical state. When it is desired to turn the first positioning device 20 to the horizontal state after the servicing work is completed, the second unlocking portion 2222 of the second limiting arm 222 is pressed so that the second locking block 2220 of the second limiting arm 222 is disengaged from the second locking hole 122. Thus, the first positioning device 20 returns to the horizontal state shown in FIG. 5.

Figure 9:
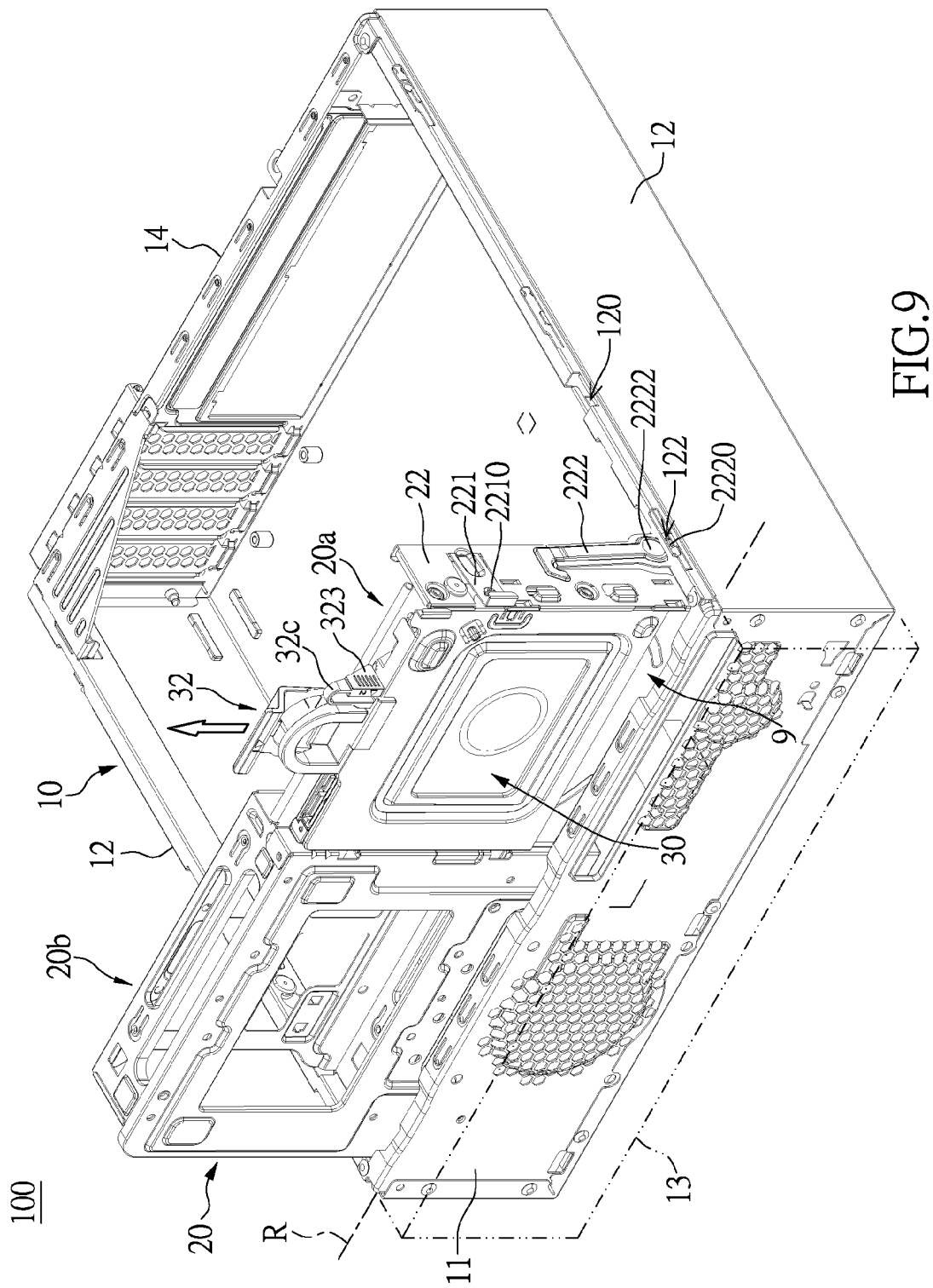
FIG. 9 and FIG. 10 are perspective views showing that the second positioning device of the housing of the present invention can be completely drawn from the first positioning device.
Figure 10:
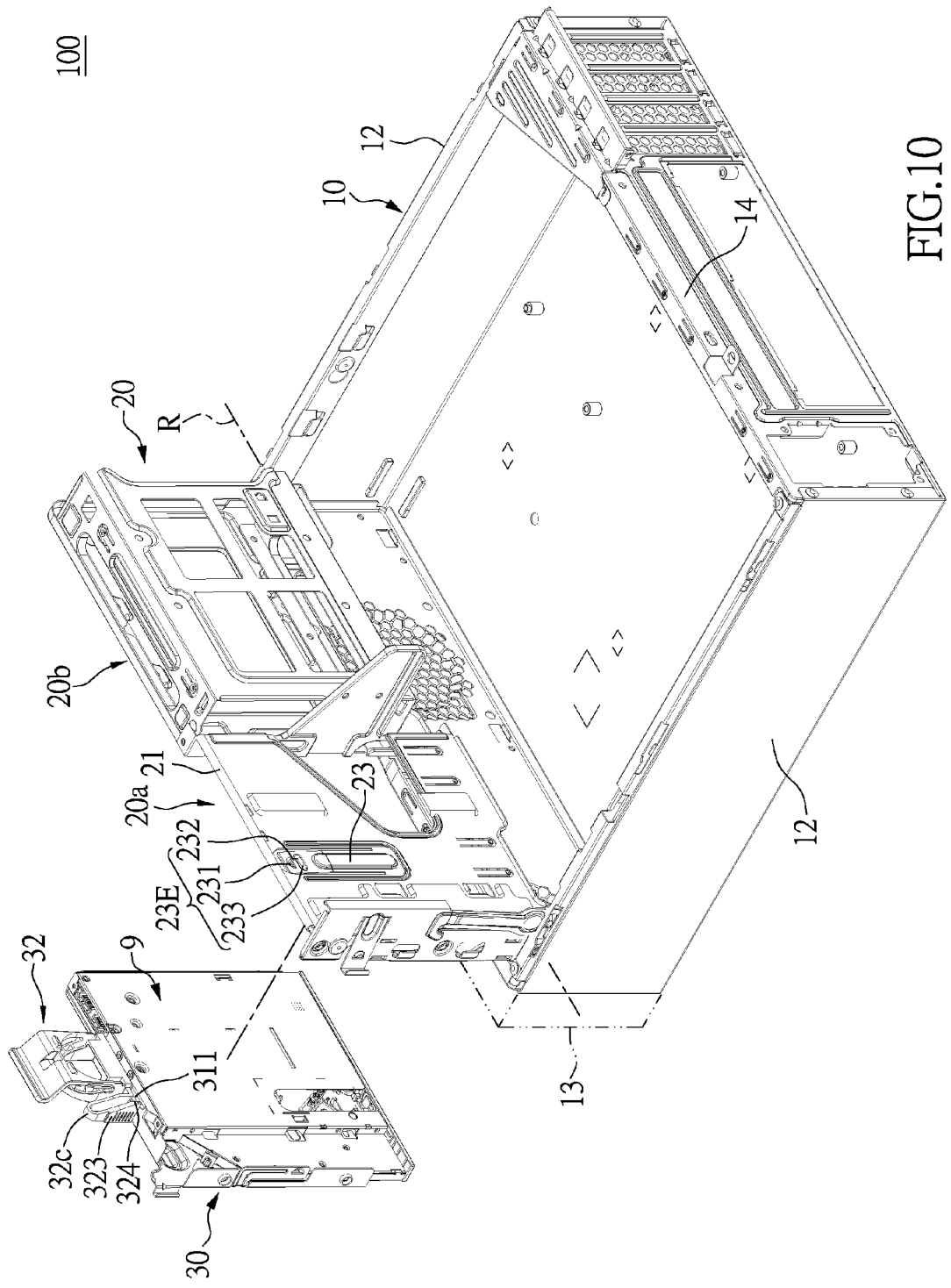

As shown in FIG. 9 and FIG. 10, if it is further required to remove the second positioning device 30, the unlocking button 32c of the second positioning device 30 is pressed and the oblique abutting portion 324 at the end of the unlocking arm 323 can push the outer bump 231 downwards so that the frame limiting portion 311 of the first fixing member 31 is disengaged from the recess 232 between the pair of bumps 231, 233. Therefore, the second positioning device 30 can be drawn outwards to be separated from the first positioning device 20, as shown in FIG. 10. Alternatively, the bent portion 234 at the free end of the positioning arm 23 may also be directly pressed by the operator so that the positioning arm 23 is separated from the frame limiting portion 311 of the first fixing member 31.

In the case of other special situations, for example, when the electronic device 9 needs to be removed from the second positioning device 30 in order to replace the electronic device 9, the removal speed of the electronic device 9 is very high in this embodiment. As shown in FIG. 3A, it is only required to press the holding arm 342 of the second positioning device 30 to remove the electronic device 9.

Possible Effects of the Embodiment

To sum up, the beneficial effects of the present invention are that, through the design of the second positioning device 30 in the embodiment of the present invention, by handling the second fixing member 32, the operator can conveniently fix the electronic device 9 in two different positions on the first positioning device 20: the first position, shown in FIG. 1 and FIG. 2, for normal operation of the mainframe, or the second position, shown in FIG. 5 and FIG. 6, for servicing of the mainframe. In this way, the operator can conveniently maintain components inside the mainframe without removing the electronic device 9 and the cables connected thereto. When the electronic device 9 needs to be removed, it is only required to laterally press the unlocking button 32c of the second fixing member 32, whereby the second positioning device 30 can be completely detached from the first positioning device 20.

Furthermore, in this embodiment, when the electronic device 9 is installed or removed, the first positioning device 20 is in the vertical state relative to the housing body 10, so the movement distance of the second positioning device 30 for fixing the electronic device 9 in the installment or removal process does not occupy the internal space of the housing body 10. Therefore, in this embodiment, the size of the housing body 10 may also be reduced.

The description above is only preferred embodiments of the present invention and is not intended to limit the scope of the present invention. All equivalent technical changes made according to the specification and drawings of the present invention should fall within the scope of the present invention.

What is claimed is:

1. A housing having a fixing mechanism, for holding an electronic device, the housing comprising:
    a housing body, having a front plate; and
    a fixing mechanism, including:
    a first positioning device, rotatably connected to the housing body and configured to rotate around a rotation axis R, wherein the first positioning device has an accommodating portion, the accommodating portion has a wall surface, and
    a second positioning device, received in the accommodating portion of the first positioning device, wherein the second positioning device has a first fixing member for accommodating the electronic device and a second fixing member connected to a side end of the first fixing member to fix the first fixing member and the electronic device in a first position or a second position on the first positioning device,
    wherein the second fixing member is detachably engaged with the wall surface of the first positioning device to fix the second positioning device in the first position on the first positioning device, and a front end of the electronic device extended outside the front plate of the housing body;
    wherein the second fixing member is disengaged from the wall surface so that the second positioning device with the electronic device are moved and fixed in the second position on the first positioning device, and the front end of the electronic device is separated from the front plate of the housing body, whereby the first positioning device and the second positioning device with the electronic device are in a rotatable state relative to the housing body about the rotation axis R.

2. The housing having a fixing mechanism according to claim 1, wherein at least one engaging block is formed on a bottom surface of the second fixing member and at least one engaging hole is formed on the wall surface of the accommodating portion, wherein the at least one engaging block is engaged in the at least one engaging hole.

3. The housing having a fixing mechanism according to claim 2, wherein the second fixing member includes a pull ring and a wrench portion on a bottom surface of the pull ring, the at least one engaging block being formed on a bottom surface of the wrench portion.

4. The housing having a fixing mechanism according to claim 1, wherein a positioning arm is provided on the wall surface of the accommodating portion, so that when the second fixing member is disengaged from the wall surface, the positioning arm is engaged with the first fixing member to fix the second positioning device in the second position on the first positioning device.

5. The housing having a fixing mechanism according to claim 4, wherein the first fixing member has a frame limiting portion and the positioning arm has a bracket limiting portion, wherein the frame limiting portion of the first fixing member is detachably engaged with the bracket limiting portion of the positioning arm to fix the second positioning device in the second position on the first positioning device.

6. The housing having a fixing mechanism according to claim 5, wherein the frame limiting portion of the first fixing member is a plate protruding downwards from the first fixing member, and the bracket limiting portion of the positioning arm includes a pair of bumps and a recess between the pair of bumps, the plate being limited in the recess.

7. The housing having a fixing mechanism according to claim 5, wherein the second positioning device further includes an unlocking button at a side of the second fixing member, an unlocking arm is elastically extended from the unlocking button, the unlocking arm is close to the frame limiting portion of the first fixing member and pushes against the positioning arm of the first positioning device so that the positioning arm is separated from the frame limiting portion of the first fixing member.

8. The housing having a fixing mechanism according to claim 1, wherein the accommodating portion further has a pair of side walls connected two sides of the wall surface, wherein a limiting structure is formed between a side of the second positioning device and the pair of side walls of the accommodating portion to limit a moving route of the second positioning device from the first position to the second position to be in a longitudinal direction of the side walls of the accommodating portion.

9. The housing having a fixing mechanism according to claim 8, wherein a pair of shaft portions protrudes from each of two sides of the second positioning device, and a guide rail is formed on each of the pair of side walls of the accommodating portion, wherein the guide rail is substantially L-shaped and has a longitudinal portion parallel to a longitudinal direction of the side walls and an outlet portion formed by bending and extending the longitudinal portion.

* * * * *